(12) United States Patent
Roskowski et al.

(10) Patent No.: US 7,572,402 B2
(45) Date of Patent: Aug. 11, 2009

(54) METHOD OF OVERMOLDING CIRCUIT

(75) Inventors: Steven J. Roskowski, Farmington Hills, MI (US); Kenneth W. Morgan, Lake Orion, MI (US); Gregg W. Petrosky, Warren, MI (US); Gregory S. Lewis, Clinton Township, MI (US)

(73) Assignee: BorgWarner Inc., Auburn Hills, MI (US)

( * ) Notice: Subject to any disclaimer, the term of this patent is extended or adjusted under 35 U.S.C. 154(b) by 759 days.

(21) Appl. No.: 11/174,696

(22) Filed: Jul. 5, 2005

(65) Prior Publication Data
US 2006/0038322 A1    Feb. 23, 2006

Related U.S. Application Data

(60) Provisional application No. 60/602,206, filed on Aug. 17, 2004.

(51) Int. Cl.
*B29C 45/14* (2006.01)

(52) U.S. Cl. .................. 264/272.11; 30/300; 83/13; 29/402.06

(58) Field of Classification Search .......... 264/272.17, 264/272.11; 30/301, 300; 29/402.06; 83/13

See application file for complete search history.

(56) References Cited

U.S. PATENT DOCUMENTS

| | | | | |
|---|---|---|---|---|
| 2,519,908 A | * | 8/1950 | Howard et al. | 33/671 |
| 4,413,413 A | * | 11/1983 | Romania et al. | 30/300 |
| 5,823,071 A | | 10/1998 | Petrosky et al. | |
| 6,056,908 A | | 5/2000 | Petrosky et al. | |
| 6,164,160 A | | 12/2000 | Nassar | |

OTHER PUBLICATIONS

Intertronics, "PC Board Rework and Repair: A Comprehensive Guide" Jan. 5, 1998, pp. 76-77, http://www.intertronics.co.uk/resource/guide1.pdf.*

* cited by examiner

*Primary Examiner*—Christina Johnson
*Assistant Examiner*—Galen Hauth
(74) *Attorney, Agent, or Firm*—Warn Partners, P.C.

(57) ABSTRACT

A method is provided for the punching of a bridge break and thereafter sealing the bridge break during the injection molding process of the lead frame. The bridge breaking tool is placed over the bridge that is to be broken. The collar presses down on the circuit and the punch presses down on the bridge with enough force to form the bridge break. Once the bridge break is formed the punch is retracted from the cavity of the template and molten polymer is injected to flow around the ends of the bridge break. The bridge breaking tool's hold down collars and retracted punch form a molding area for molten polymer to flow over the bridge break and the exposed circuit area. The bridge breaking tool is retracted after the bridge break is encased in the cured molten polymer and the cured molten polymer forms a lead frame structure.

5 Claims, 3 Drawing Sheets

METHOD OF OVERMOLDING CIRCUIT

CROSS-REFERENCE TO RELATED APPLICATIONS

This application claims the benefit of U.S. Provisional Application No. 60/602,206, filed Aug. 17, 2004. This disclosure of which is incorporated herein by reference.

FIELD OF THE INVENTION

The present invention relates to a method of forming and sealing bridge breaks while overmolding a lead frame.

BACKGROUND OF THE INVENTION

It is known to those in the art that during the manufacture of lead frames the individual circuits are often pre-fabricated and connected to other circuits by bridges. It is also known in the art that these bridges can be broken, or punched, in order to prevent the flow of electrical current between the two circuits the bridge connected. The present invention discloses a method for creating a sealed bridge break between two circuits by using a bridge breaking tool. The bridge breaking tool punches a bridge forming the bridge break and then molten polymer flows around the bridge break and insulating the ends of the bridge break.

One problem with bridge breaks in the prior art is that they are susceptible to contaminate particles, which can rebridge the two circuits that were connected by the original bridge, and cause an unwanted electrical current to flow between the circuits. This type of unwanted occurrence can cause a short circuit and damage to the lead frame. Therefore, it is desirable to have a method of breaking the bridges and sealing the broken ends of the bridge breaks when the lead frame is overmolded onto a backing. Sealing the broken ends of the bridge breaks prevents silting and contaminants from rebridging the circuit and causing a short circuit that will damage the lead frame and other circuitry.

SUMMARY OF THE INVENTION

The present invention is directed to a method of punching a bridge break and thereafter sealing the bridge break during the injection molding process, where the lead frame is molded onto or within a plastic backing. The tool that is used during this process has a collar which presses against the circuits and a punch which breaks the bridges.

The bridge breaks are formed and encased with molten polymer during molding of the frame. The process begins with the circuits that are connected by bridges being placed on a template. Next, the bridge breaking tool is placed over the bridge that is to be broken. The collar presses down on the circuit, and the punch presses down on the bridge with enough force to form the bridge break. Once the bridge break is formed the punch is retracted from the cavity of the template and molten polymer is injected and flows around the ends of the bridge break. Features in the bridge breaking tool's hold down collars, in conjunction with the retracted punch, form a molding area for molten polymer to flow over the bridge break and the exposed circuit area. The bridge breaking tool is retracted after the bridge break is encased in the cured molten polymer and the cured molten polymer forms a lead frame structure.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
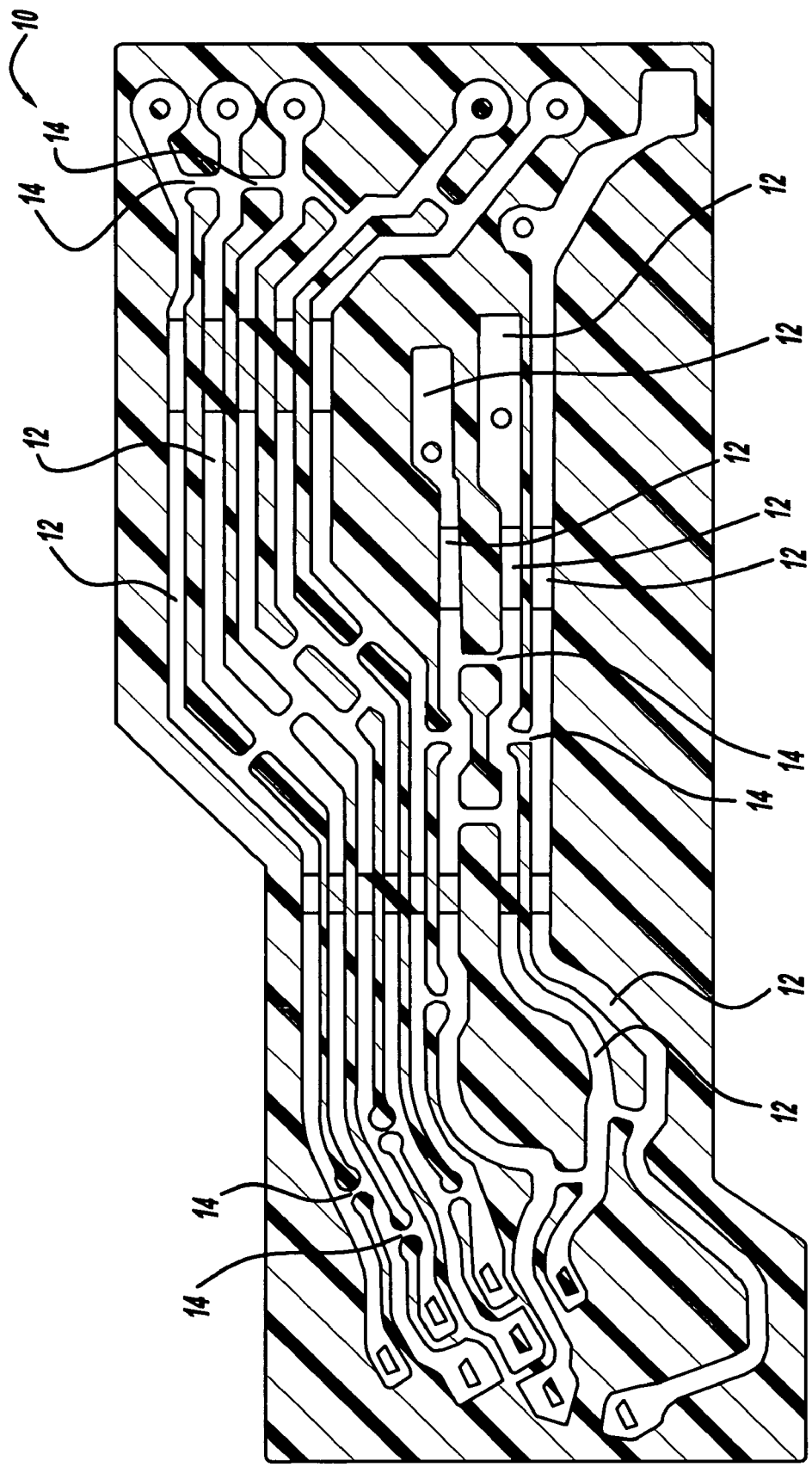
FIG. 1 is a plan view of a lead frame prior to the formation of a bridge break.

Referring to FIG. 1, a lead frame 10 has individual circuits 12 which are connected by bridges 14. The bridges 14 allow electrical current to flow between the circuits 12 that are connected by the bridges 14. At times it may be desirable to break one or more of the bridges 14 in order to prevent the flow of electrical current between the circuits 12 that the bridges 14 connect.

Figure 2:
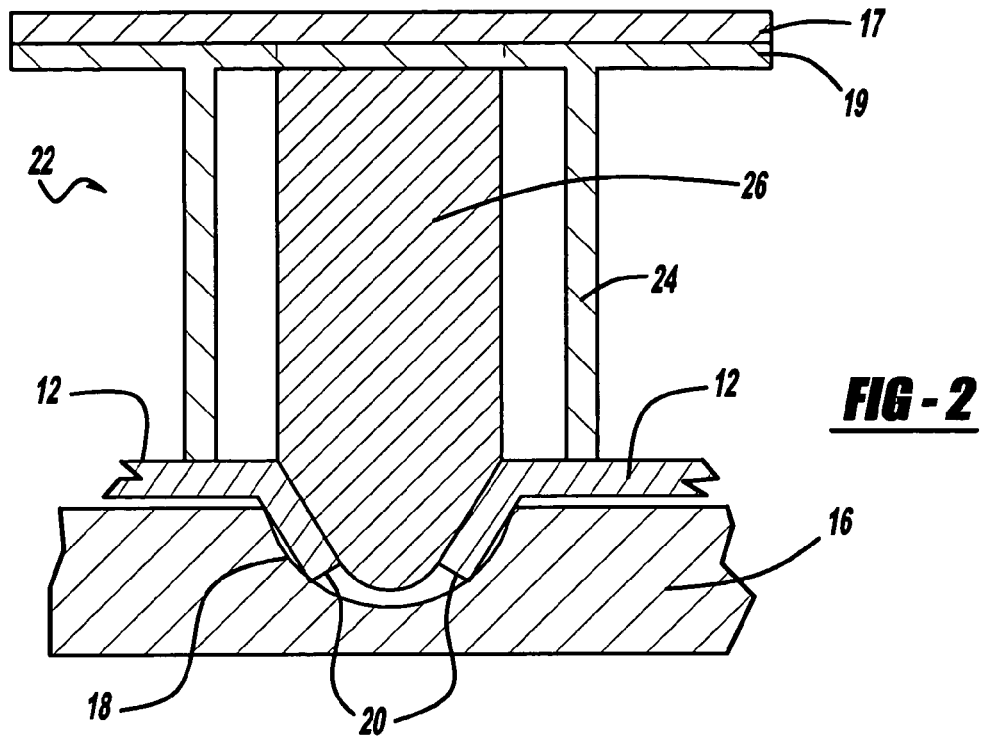
FIG. 2 is a plan view of a bridge breaking tool's punch forming a bridge break.
Figure 3:
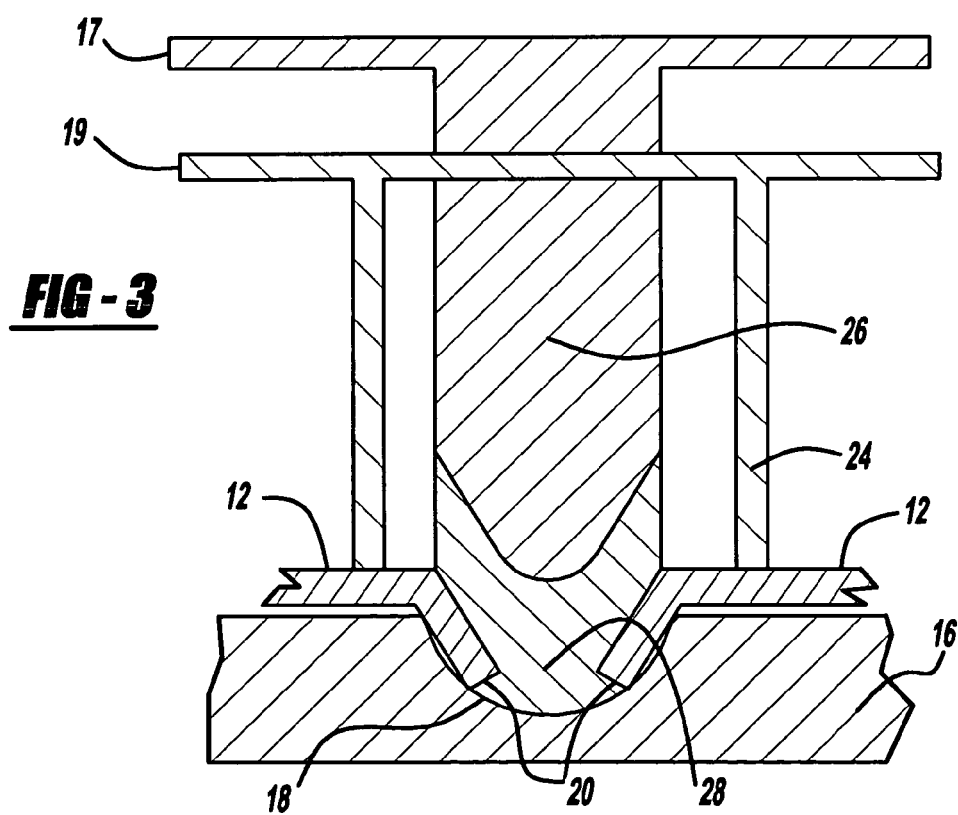
FIG. 3 is a plan view of a bridge breaking tool's punch retracted and the bridge break being encased in molten polymer.

FIGS. 2 and 3 show the method of punching the bridge and sealing the bridge break with plastic molding. Referring to FIG. 2, circuits 12 are placed on a mold template 16. The template 16 has a cavity 18 where the bridge break 20 will be formed. A bridge breaking tool 22 has at least one collar 24 and at least one punch 26. The punch 26 is mounted onto a first backing 17, and the collar 24 is mounted onto a second backing 19. The collar 24 has an aperture which extends through the second backing, and allows the punch 26 to move through the second backing 19 and collar 24. The first backing 17 and the second backing 19 are parallel to the template 16 and move perpendicular to the template 16, so that the collar 24 can contact the circuit 12 and the punch can contact the bridge 14. The first backing 17 is parallel to the second backing 19 and moves perpendicular to the second backing 19, such that the punch 26 can extend longitudinally through the collar's 24 axial bore.

A bridge break 20 is formed when the bridge breaking tool 22 is placed over the bridge 14 that is to be broke. Next, the collar 24 presses on the circuit 12 by the second backing 19 moving perpendicular to the template 16, so that the second backing 19 moves closer to the template 16. The collar 24 presses on the circuit 12 in a way that presses the circuit 12 into the lead frame molding 16 on at least one side of the cavity 18. It is preferred that the collar's base 27 have a circular shape so that an equal amount of force is applied to the circuit 12 on both sides of the cavity 18. After that, the first backing 17 moves perpendicular to the second backing 19 so that the first backing 17 moves closer to the second backing 19 and the template 16. When the first backing 17 begins to move, the punch 26 moves longitudinally through the collar's 24 axial bore towards the template 16. The first backing 17 moves a sufficient distance in order for the punch 26 to contact the bridge 14. The punch 26 then creates the bridge break 20 by pressing down on the bridge 14 over the cavity 18 with sufficient force to break the bridge 14 and form the bridge break 20. The punch 24 continues to press down on the ends of the bridge break 20 so that the ends of the bridge break 20 are deformed and extend into the cavity 18.

Referring to FIG. 3, after the bridge break 20 is formed, the first backing 17 moves perpendicular to the template 16 in order for the punch 24 to be lifted from the cavity 18. The collar 24 continues to press the circuits 12, as previously described and shown in FIG. 2. As the punch 24 is lifted from the cavity 18, a molten polymer material 28 is injected around the collar 24, in the cavity 18, under the bridge break 20, and around the circuit 12. The molten polymer material 28 flows around the inside of the collar's 24 axial bore and around the tip of the punch 26 so that the ends of the bridge break 20 are surrounded with molten polymer 28. The molten polymer 28 also covers a portion of the circuits 12 that are outside the cavity 18.

Figure 4:
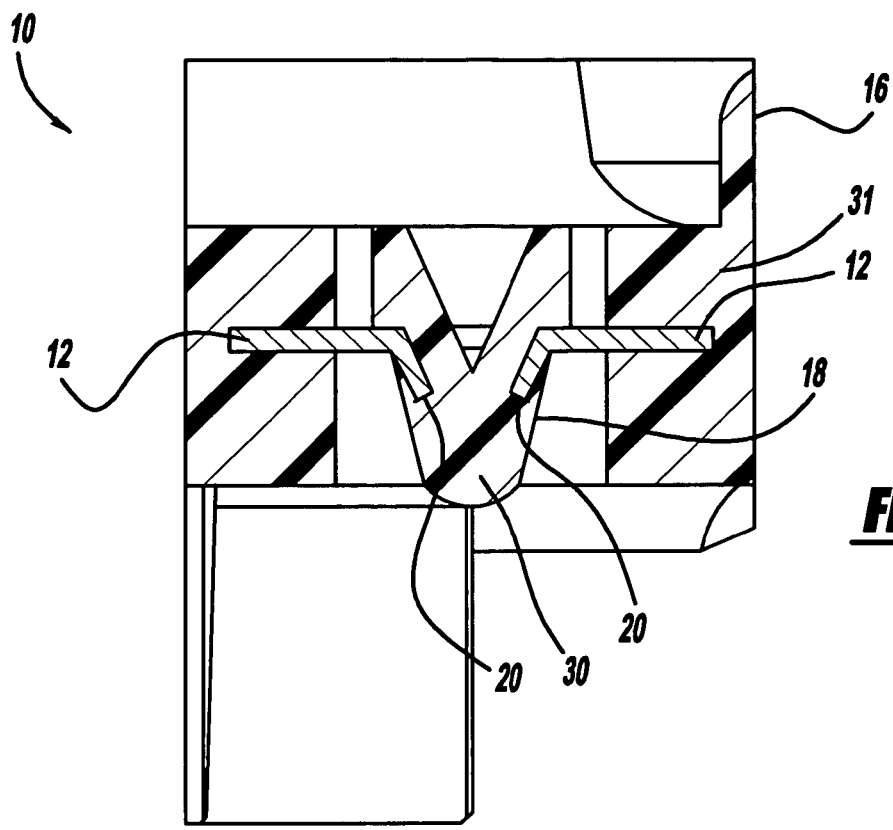
FIG. 4 is a plan view of a lead frame with a bridge break that is sealed.

FIG. 4 shows the lead frame 10 after the bridge breaking tool 22 is removed. When the molten polymer 18 cures it becomes an insulated hardened plastic material 30 that forms a lead frame 31. The cavity 18 is filled with an insulated hardened plastic material 30, such that the ends of the bridge break 20 are encased in the insulated hardened plastic material 30. Thus, the ends of the bridge break 20 are electrically isolated from each other and they cannot be bridged together by silting and contaminants. In addition, portions of the circuit 12 are encased in the insulated hardened plastic material 30.

Figure 5:
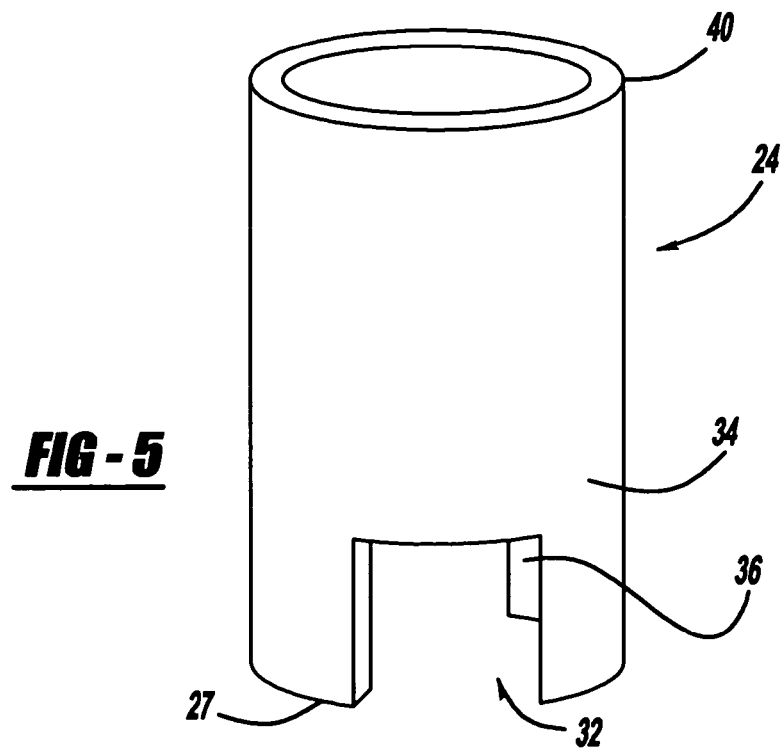
FIG. 5 is a perspective side view of a collar of the bridge breaking tool.

The collar 24, due to its shape, forms a molding area for the molten polymer 28. Referring to FIGS. 4 and 5, the collar 24 has at least one window 32. In the preferred embodiment the window 32 is formed by removing a square shape section from the entire width of the collar 24. The window 32 extends from the base of the collar 27 towards the top of the collar 40. The window's 32 height is a sufficient height so that when the collar 24 is presses down on the circuits 12 a molding area is formed that will allow the molten polymer 28 to cover the bridge break 20 and a portion of the circuits 12. The window 32 allows the molten polymer material 28 to be formed across the radius of the collar 24 when the punch 26 is raised.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of creating a sealed bridge break between circuits;
    providing a template for forming a lead frame thereon;
    providing a one piece circuit frame having one or more circuits connected by one or more bridges;
    providing one or more bridge break tools each having a collar and a punch;
    providing a polymer material;
    placing said one piece frame on the surface of said molding tool; placing said collar of each of said one or more bridge break tools against said one piece frame;
    punching one or more bridge breaks between said one or more bridges using said one or more bridge break tools;
    lifting said punch of each of said one or more bridge break tools away from said bridge break and keeping said collar of each of said one or more bridge break tools against said one piece frame;
    flowing said molten polymer material through said collar around said one piece frame and said one or more bridge breaks;
    retracting said one or more bridge break tools; and
    curing said molten polymer material to form a solid lead frame structure having bridge breaks that are sealed by said polymer material.

2. The method of creating a sealed bridge break between circuits of claim 1 wherein said collar of said one or more bridge tools forms the exterior side of said bridge break tool wherein said collar presses and holds said one piece frame onto said template.

3. The method of creating a sealed bridge break between circuits of claim 2, wherein said punch moves through said collar and presses on said bridge forming said bridge break.

4. The method of creating a sealed bridge break between circuits of claim 1 further comprising:
    providing a first backing connected to each said punch of said one or more bridge break tools and a second backing connected to each collar of said one or more bridge break tools, wherein said first backing and said second backing contact during said step of punching and said first backing moves away from said second backing during said step of lifting.

5. The method of creating a sealed bridge break between circuits of claim 1 further comprising the step of providing at least one window on said collar that extends from the base of said collar, wherein said window allows said polymer to flow across the radius of said collar after said punch is retracted.

* * * * *